(12) United States Patent
Koliopoulos et al.

(10) Patent No.: US 7,541,826 B2
(45) Date of Patent: Jun. 2, 2009

(54) COMPLIANT PAD WAFER CHUCK

(75) Inventors: Chris L. Koliopoulos, Tucson, AZ (US);
Matthew R. Boston, Tucson, AZ (US)

(73) Assignee: KLA-Tencor Corporation, San Jose, CA (US)

( * ) Notice: Subject to any disclaimer, the term of this patent is extended or adjusted under 35 U.S.C. 154(b) by 183 days.

(21) Appl. No.: 11/129,537

(22) Filed: May 13, 2005

(65) Prior Publication Data

US 2006/0255819 A1 Nov. 16, 2006

(51) Int. Cl.
*G01R 31/26* (2006.01)

(52) U.S. Cl. ...................................... 324/765
(58) Field of Classification Search ............... None
See application file for complete search history.

(56) References Cited

U.S. PATENT DOCUMENTS

| | | | | |
|---|---|---|---|---|
| 4,642,889 A * | 2/1987 | Grabbe | ................. | 29/840 |
| 5,900,738 A * | 5/1999 | Khandros et al. | ............ | 324/761 |
| 6,287,174 B1 * | 9/2001 | Detzel et al. | ................... | 451/41 |
| 6,315,649 B1 * | 11/2001 | Hu et al. | ....................... | 451/285 |
| 6,407,006 B1 * | 6/2002 | Levert et al. | ................. | 438/761 |
| 6,464,574 B1 * | 10/2002 | Halley | .......................... | 451/490 |
| 6,547,651 B1 * | 4/2003 | Boyd et al. | ................... | 451/285 |
| 6,835,415 B2 * | 12/2004 | Blaedel et al. | ............ | 427/248.1 |
| 6,984,168 B1 * | 1/2006 | Melvin et al. | ................ | 451/285 |
| 7,029,381 B2 * | 4/2006 | Melvin et al. | ................ | 451/285 |
| 2001/0036749 A1 * | 11/2001 | Levert et al. | ................. | 438/758 |
| 2002/0127862 A1 * | 9/2002 | Cooper et al. | ............... | 438/691 |
| 2002/0137448 A1 * | 9/2002 | Suh et al. | ..................... | 451/398 |
| 2004/0131775 A1 * | 7/2004 | Blaedel et al. | ........... | 427/255.6 |

* cited by examiner

*Primary Examiner*—Jermele M Hollington
(74) *Attorney, Agent, or Firm*—Luedeka, Neely & Graham, P.C.

(57) ABSTRACT

A platform is designed to support thin flat substrates, such as semiconductor wafers, during observation of characteristics of the substrates. The platform includes a rigid base having a top surface. A resilient pad is supported on the base and the pad has a top surface, at least a portion of which yieldingly supports a flat substrate placed thereon.

5 Claims, 5 Drawing Sheets

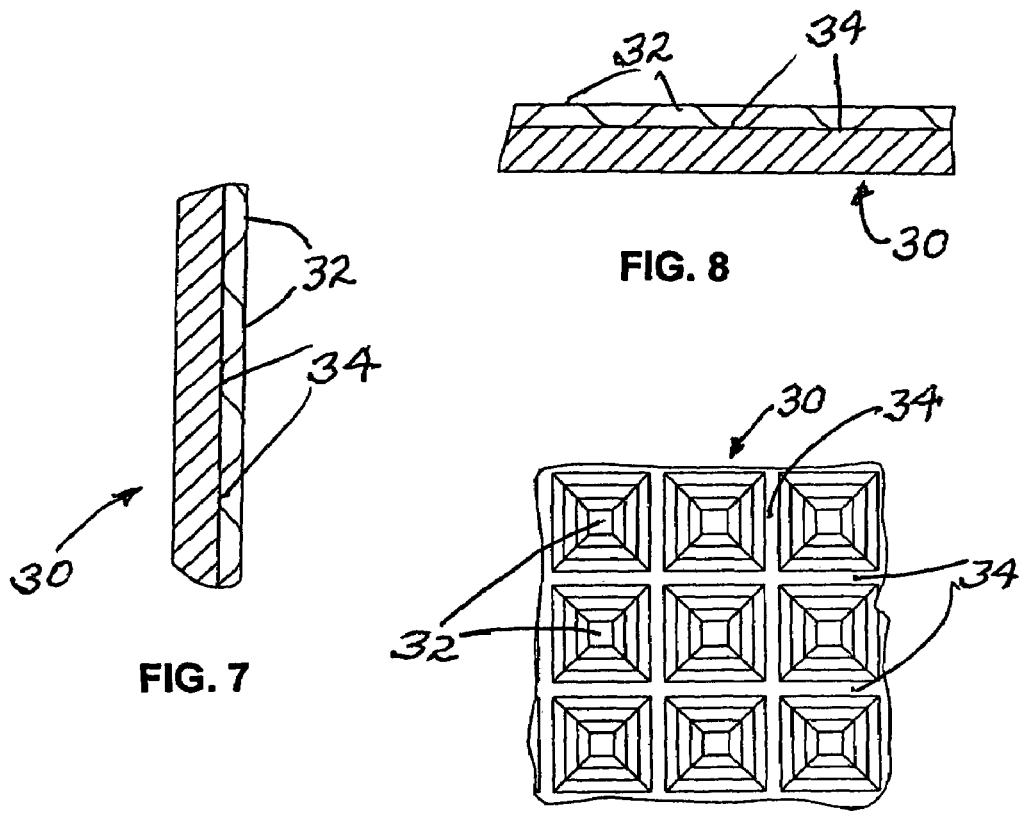
FIG. 7
FIG. 8
FIG. 9
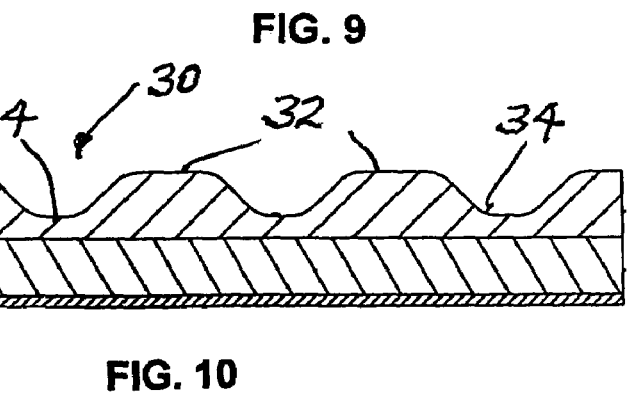
FIG. 10
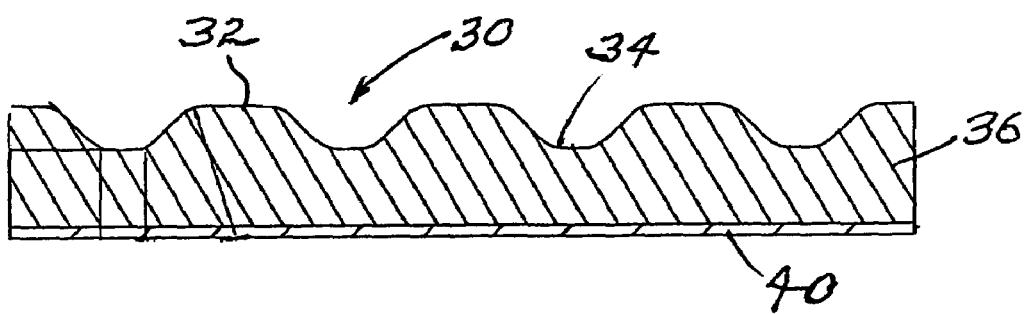
FIG. 11

COMPLIANT PAD WAFER CHUCK

BACKGROUND

Following the fabrication of thin semiconductor wafers, which typically have a diameter of 200 millimeters to 300 millimeters and a normal thickness from 725 microns to 775 microns, the wafers frequently are supported on a horizontal platform during observations or measurements of the characteristics of the wafers. These characteristics include top surface nanotopography.

Nanotopography measurements typically occur in a clean room with sophisticated metrology equipment under carefully controlled conditions. In order to ensure that the data being gathered from the detailed features which are measured on the wafer are independent of external contamination and peripheral influences, a chuck or chuck platform having a carefully polished planar surface typically is mounted to a stage which moves to facilitate measurement of different areas of the wafer. The design and construction of the chuck or chuck platform, especially the material and contact points which engage the reverse or underside of the wafer, can have a direct impact on the data gathered as the top surface is being measured. The materials from which such chucks are made are hard materials which are harder than the wafer undergoing the nanotopography measurements. Materials which have been used are: stainless steel, anodized aluminum, ceramics and various types of glass. These chucks or chuck platforms have precisely engineered flat upper surfaces, and frequently these surfaces are provided with vacuum points and channels.

The disadvantage to flat chucks made of a hard material like ceramic or stainless steel is that if the wafer is not perfectly planar, the wafer may conform to the shape of the chuck, causing the top surface of the wafer to then take on the surface characteristics of the chuck. For example, if there is a warp or a ripple in the wafer configuration, the sheer weight of the wafer itself on the upper surface of the chuck may cause the wafer to flatten out onto the chuck surface; so that the warp or ripple will not be detected by the nanotopography measurements.

Since the wafer tends to conform to the shape of a hard chuck, the top surface of the wafer then takes on similar characteristics, as described above. For example, if there is a hole or depression in the chuck, such as may be provided for air removal or vacuum holding of the wafer, then the wafer undergoes a slight corresponding deflection which is reflected as a valley or low region on the top surface of the wafer undergoing investigation. Conversely, a high spot on the chuck is seen as a peak or taller area on the top surface of the wafer. The sensitivity of these extremely thin semiconductor wafers (as mentioned above, having a normal thickness of 725 to 775 microns) is such that even sub-micron particles on the surface of the chuck may provide sufficient of the wafer to cause a "print through" of the particle on the upper surface of the wafer. This then results in erroneous measurements for nanotopography investigations.

Even though the measurements, such as nanotopography measurements, are conducted in a clean room, the high number of wafers which are transferred onto and removed from chucks in the course of a given period of time leads to the possibility of sub-micron particle contamination of the top of the chuck, thereby distorting the data which is obtained from the top surface wafer measurements.

Another type of chuck which has been used is a low-contact (pin) chuck which holds the wafer at only a few points. A disadvantage to low-contact chucks is that the points "print through" or cause high points or mountains to appear on the upper surface of the wafer under investigation opposite the contact pins holding the wafer.

A different type of chuck which has been used with nanotopography is a chuck with a flat upper surface, but with vacuum points and channels. The disadvantage of flat chucks made of hard material, as described above, is that the vacuum tends to pull the wafer down onto the chuck surfaces; so that the supporting surfaces between the vacuum channels tend to appear as high spots or mountains on the wafer surface undergoing measurement. Chuck designs involving removal of much of the chuck surface also result in mesas or high points on the chuck. However, as with other low contact chucks, the mesas on the surface of the hard chuck also can be seen as a print through on the top surface of the wafer undergoing measurement.

It is desirable to provide a support platform for wafers and other flat substrates not subject to the above disadvantages.

BRIEF DESCRIPTION OF THE DRAWINGS

FIG. 7 is an enlarged partial cross-sectional view taken along the line 7-7 of FIG. 5;

FIG. 8 is an enlarged partial cross-sectional view taken along the line 8-8 of FIG. 5;

FIG. 9 is an enlarged partial top view showing details of the embodiment shown in FIG. 5;

FIG. 10 is an enlarged cross-sectional view of an embodiment of the invention;

FIG. 11 is an enlarged cross-sectional view of an alternate embodiment of the invention.

DETAILED DESCRIPTION

Reference now should be made to the drawings, in which the same reference numbers are used throughout the different FIGS. to designate the same or similar components. Before entering into a discussion of the embodiments of the invention, it should be noted that only those portions of known prior art equipment for handling and transporting semiconductor wafers for surface measurement, testing and evaluation are shown. Standard apparatus, including the platforms, the wafer handling robots and the measurement apparatus, such as nanotopography interferometers have not been shown, since these components all operate in their conventional manner.

Figure 2:
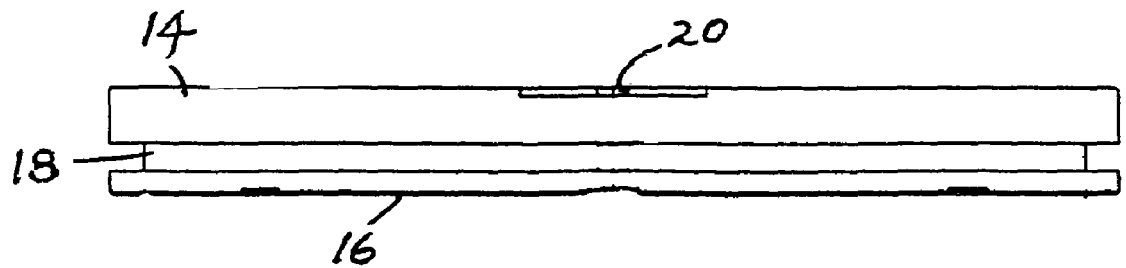
FIG. 2 is a side view of the chuck base shown in FIG. 1.
Figure 1:
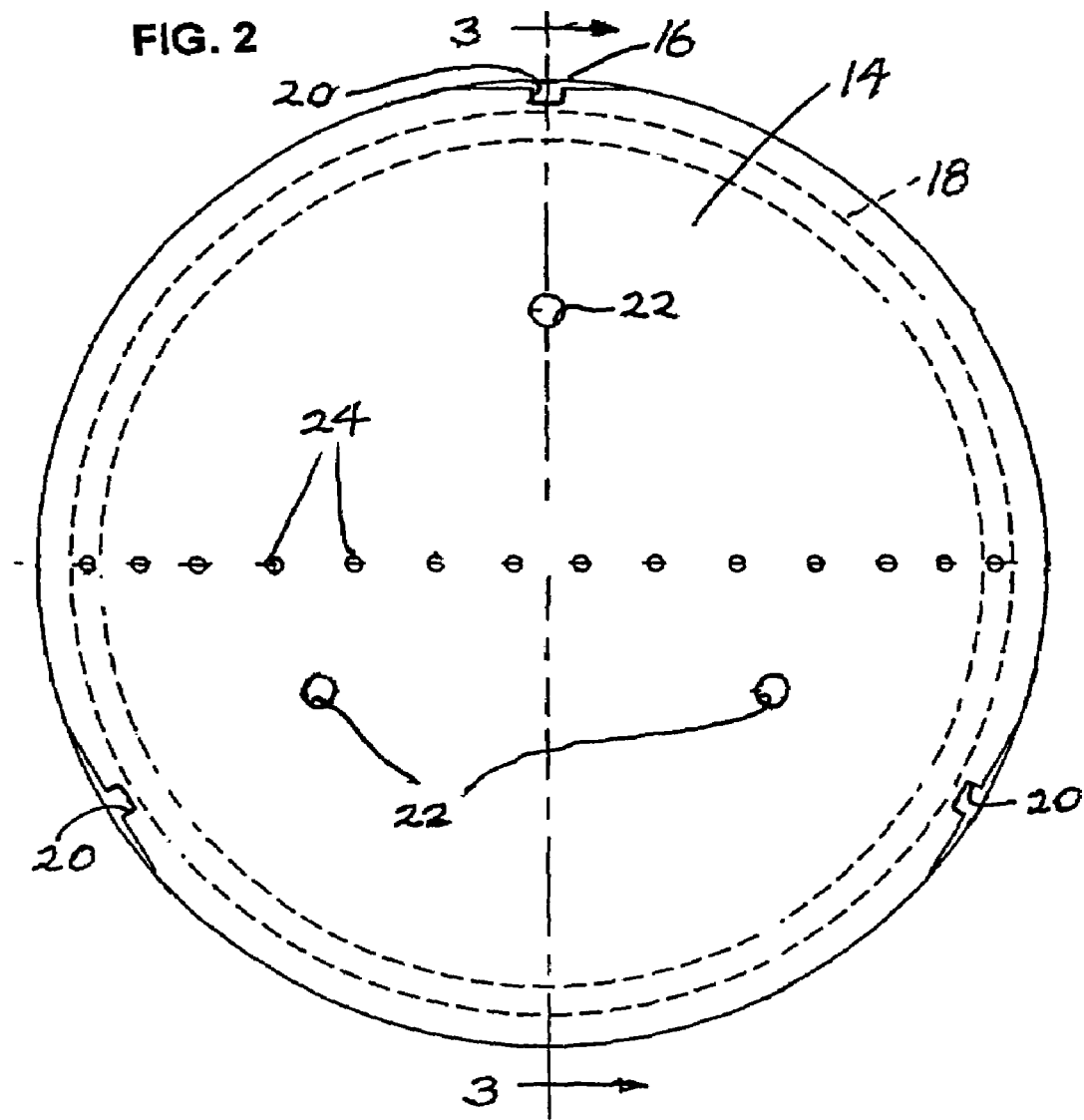
FIG. 1 is a top view of a chuck base used in conjunction with embodiments of the invention.

FIG. 1 is a top view of a chuck or chuck platform in the form of a rigid base member having a top surface 14. The top surface is part of a unitary or multi-part chuck base member in a circular shape for supporting circular semiconductor wafers of the size ranges between 200 mm and 300 mm, as mentioned above. The top 14 is located on an undercut intermediate area 18, which in turn is supported on a bottom portion 16, which may be solid or comprised of a support ring with an undercut center, or assume a number of different configurations. The region 18 has a diameter which is less than the diameter of the top 14, as is readily apparent from an examination of the top view in FIG. 1. This is done to allow captivation of the chuck onto the x-y stage (not shown) needed for the metrology process. The three notches 20 on the periphery of the chuck allow the operation of lifter fingers to engage the outer edge of a semiconductor wafer which is placed on and removed from the chuck base member 14/16/18 in a conventional manner.

Figure 3:
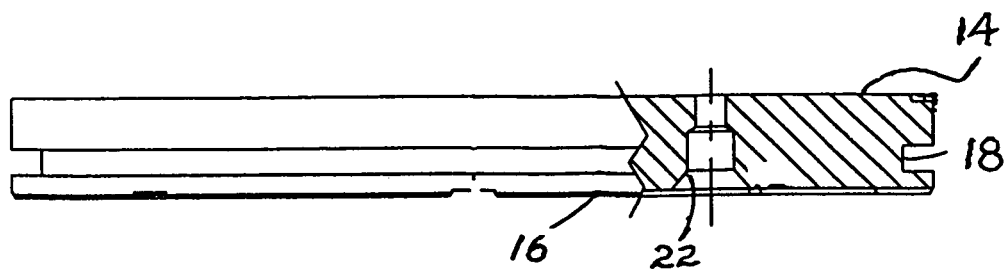
FIG. 3 is a partially cut-away side view taken along the lines 3-3 of FIG. 1.

The chuck base member 14/16/18 also has three holes 22 passing through it, spaced apart from one another by 120°. The holes 22 are provided to accommodate the reciprocal movement of lift pins (not shown) also used in lifting a semiconductor wafer off or away from the surface 14 of the chuck member after its surface characteristics have been evaluated by apparatus (not shown). These holes 22 also serve to vent air during placement of a flat substrate (such as a semiconductor wafer) onto the chuck. In addition to the holes 22, a plurality of smaller holes 24 are shown as located along one of the diameters of the chuck base member 14/16/18. These holes 24 are for the purpose of allowing the passage of air from the surface 14 into the atmosphere located below the chuck base member. While the holes 24 are show along a single diameter of the base member 14/16/18, the holes may be placed along more than one diameter, or be placed in any pattern, including random patterns on the surface 14 and through the chuck member to the space located beneath it. FIG. 3 shows the manner in which the lift pin holes 22 pass through the chuck member from the top to the bottom; and FIG. 4 also shows these holes 22 opening through the bottom of the chuck member.

Figure 4:
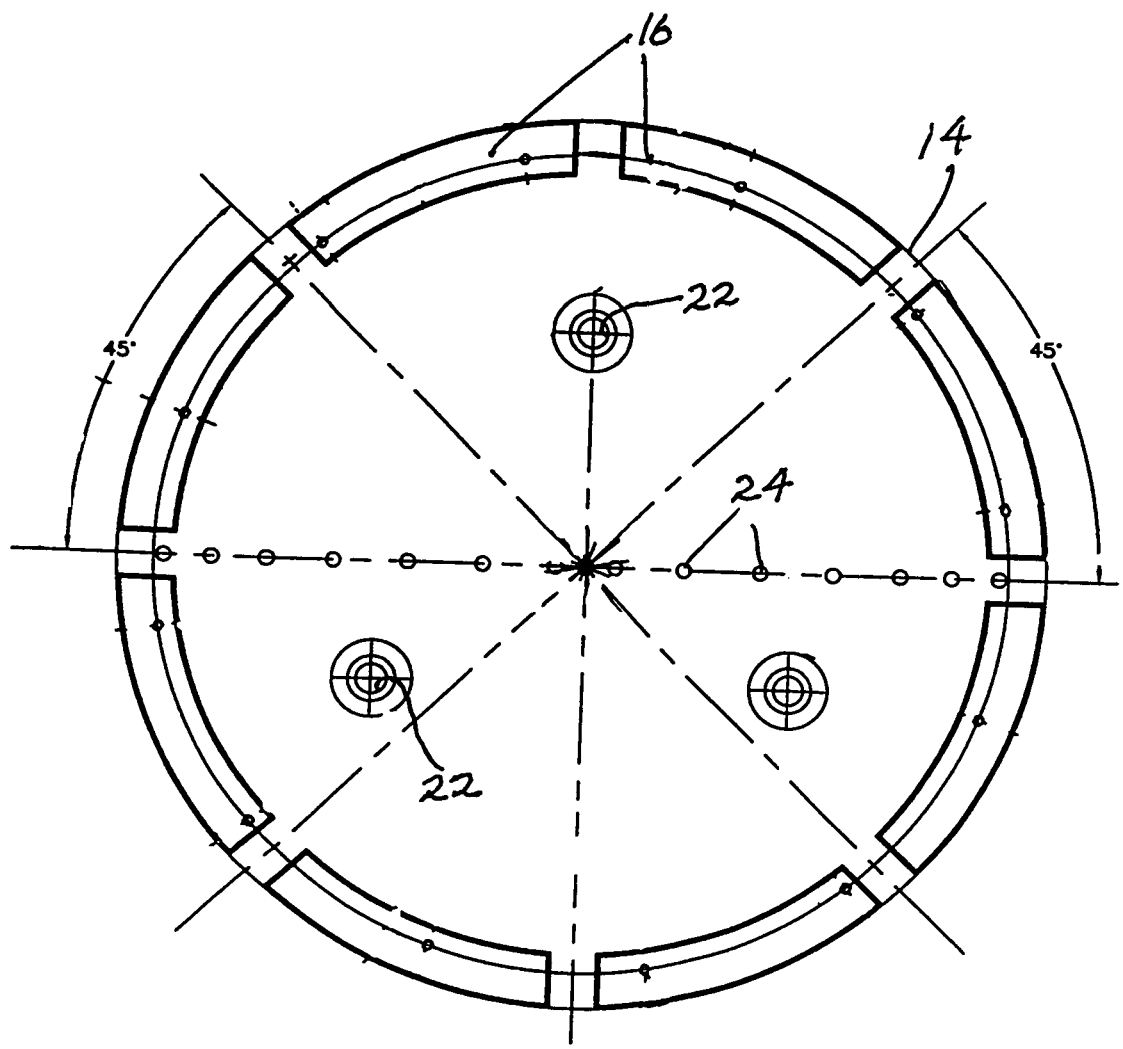
FIG. 4 is a bottom view of the chuck base shown in FIG. 1.

As illustrated in FIG. 4, the chuck base member may include a segmented bottom ring portion 16 for attachment to other parts of the apparatus with which it is used. As shown in FIG. 4, the segments 16 are spaced from one another and include eight segments located at 45° intervals about the periphery of the chuck base member. The particular configuration of the underside of the chuck base member 14/16/18 and of other operative portions of the chuck base member are not important to an understanding of the embodiments of the present invention.

Typically, the chuck base member is made of stainless steel, anodized aluminum, aluminum with inert coatings, ceramics or glass. All of these may be considered hard materials; and they typically are used for the support surfaces for use in conjunction with horizontally supported semiconductor wafers undergoing surface testing and evaluation.

The top surface 14 of the chuck base member is a highly polished surface designed to be flat or planar. The equipment with which it is used is operated in a clean room; but even so, tiny particles of contamination (in the micron or sub-micron range) still may fall on the surface. These particles are sufficient to cause bending distortion of a semiconductor wafer which is placed on top of them over the surface 14 of the chuck base, since the surface 14 does not yield but is a hard surface.

In order to overcome the inherent distortions which can and do occur in conjunction with hard surface chuck base members, such as the surface 14, a deformable pad member 30 (shown in FIG. 3) made of polyurethane foam or other suitable material is adhesively secured to the upper surface 14 of the chuck base member 14/16/18. Holes 31 are formed through the pad member 30 to align with the holes 22 in the chuck base member to allow lift pins of lifting mechanism to pass through the pad 30, as well as through the chuck base member 14/16/18.

Figure 5:
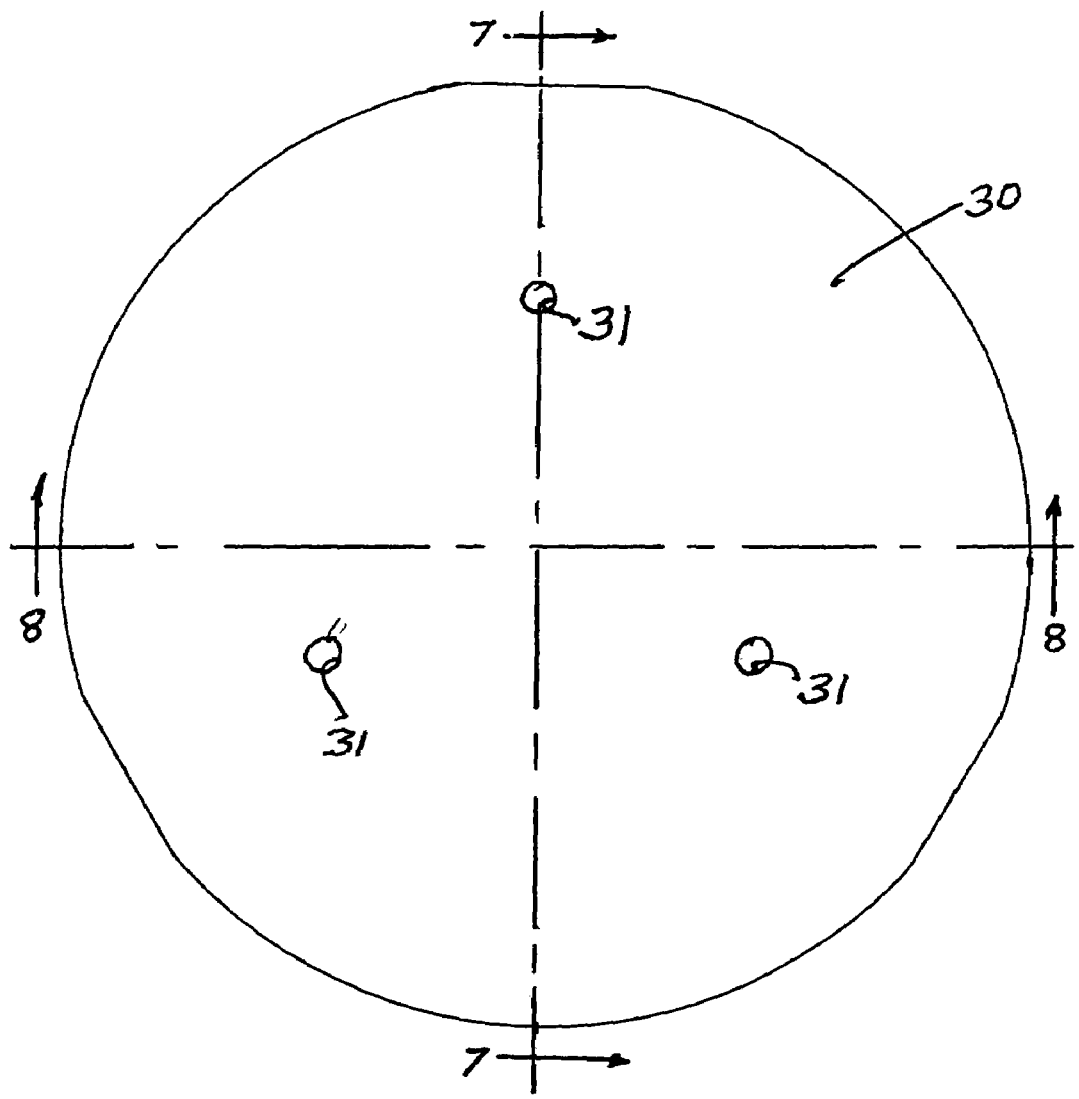
FIG. 5 is a top view of an embodiment of the invention.
Figure 6:
FIG. 6 is a side view of the embodiment shown in FIG. 5.

The pad 30 covers substantially the entire top surface 14 of the chuck base member. FIG. 6 provides a relative comparison of the thickness of the pad 30, with respect to its diameter as shown in FIG. 5. Reference now should be made to FIGS. 10 and 11, which show alternative forms of the pad member 30. As shown in FIG. 10, the pad member 30 includes an upper surface layer 36 with a typical thickness of 0.035 inches to 0.065 inches. This surface layer is made of microporous polyurethane or other suitable elastomeric material. The material 36 is carried by a polyurethane impregnated polyester felt layer 38, which in turn has a pressure sensitive adhesive 40 on its bottom. The adhesive 40 is used to secure the pad 30 to the top 14 of the chuck base member. The layer 38 typically has a thickness of 0.025 inches; although the relative dimensions of the various layers may be changed to suit any particular desired operating condition. It should be noted that in FIG. 10 the relative thicknesses and sizes of the different components are exaggerated for purposes of illustration.

FIG. 11 shows an alternative to the embodiment shown in FIG. 10, in which the layer 38 has been eliminated and the entire pad 30 is comprised of a microporous material 36, with a pressure sensitive adhesive 40 on its lower surface. The manner in which the embodiments of FIGS. 10 and 11 function to support a semiconductor wafer or other thin wafer material is substantially the same.

Reference now should be made to FIGS. 10 and 11 in conjunction with FIGS. 7, 8 and 9. FIG. 7 is a partial cross-sectional view taken along the line 7-7 of FIG. 5. FIG. 8 is a partial cross-sectional view taken along the line 8-8 of FIG. 5. FIG. 9 is a top view, substantially enlarged, of a portion of the top of the pad shown in FIG. 5. As is apparent from an examination of FIGS. 7 through 11, the top surface consisting of the microporous layer of material 36 has a number of islands 32 located in a geometric pattern separated by grooves or valleys 34. These are illustrated in the cross-sectional views 7,8,10 and 11 and are also evident from an examination of the top view in FIG. 9.

It should be noted that all of FIGS. 7, 8, 9, 10 and 11 are greatly enlarged. Typically, the top surfaces 32 are located in a plane which is parallel to the plane of the surface 14, and have an area, in a working embodiment, of approximately 0.08 inches square. The density of these islands or raised areas 32 is substantially 100 per square inch. As noted above, the thickness of the surface layer, in other words the thickness between the peaks or tops of the islands 32 and the grooves or valleys 34, is between 0.035 inches and 0.065 inches.

Figure 12:
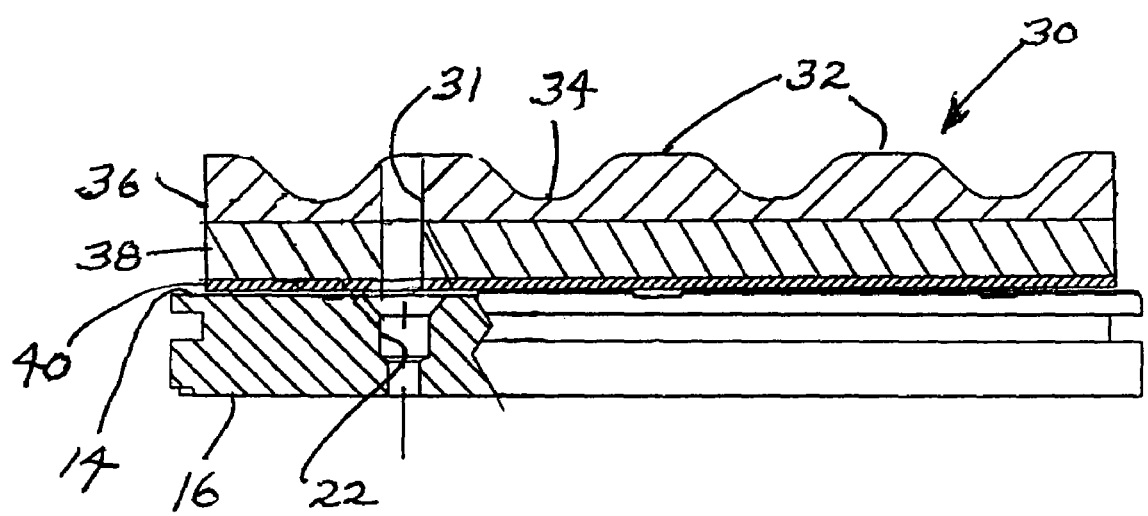
FIG. 12 is a cross-sectional assembly view illustrating the manner of mounting the embodiment shown in FIG. 10 on the base member shown in FIG. 3.

FIG. 12 is a cross-sectional view showing the pad 30 construction of FIG. 10 secured to the top surface 14 of the chuck base member illustrated in partial cross section of FIG. 3. The relative dimensions of the various parts are distorted in FIG. 12 for purposes of illustration, because it should be noted that the overall thickness of the compliant surface layer 36 is substantially less than the thickness, for example, of the chuck base member 14/16/18. The diagram of FIG. 12 is provided for purposes of illustrating the manner in which the various components fit together. It also should be noted that the embodiment shown in FIG. 11 could be used as well in conjunction with the overall construction shown in FIG. 12. A separate drawing showing the interconnection of the alternative embodiment of FIG. 11 on the surface 14 of the chuck base member has not been given, since it is considered evident and would be nearly identical to the one shown in FIG. 12 for the embodiment of FIG. 10.

When the pad 30 is placed on the surface of the chuck base member 14, any air which may be trapped between the lower surface of the pad 30 having the adhesive layer 40 on it and the upper surface 14 of the chuck base member, is allowed to pass through the chuck base member through the holes 24 and 22.

In preparing the apparatus for use, the pad 30 is carefully pressed onto the surface 14 of the chuck base member by hand; and then a roller tool is used to drive the air bubbles out through the holes 24 and 22. If pressure sensitive self-adhesive surface layer 40 is not used, the adhesive may be applied to the surface 14 instead of to the underside of the pad 30. It is believed, however, that the utilization of a pressure sensitive adhesive 40 on the bottom surface of the pad is convenient.

Once the pad 30 has been secured to the surface 14 of the chuck base member, the upper surfaces 32 are lapped to create a flat, planar surface on the wafer contact area. Lapping may be performed using an automatic machine designed to perform lapping and polishing. Typically, the lapping tool is a ground glass surface, and a compliant surface is placed in contact with the ground glass tool surface, with de-ionized water as a lubricant. The machine is then put into operation until all of the tops of the islands 32 are deemed to be flat, that is in the same plane.

The distance between adjacent islands 32 is selected in accordance with the parameters of the thin semiconductor wafers or other flat substrates which are to be placed on the surface of the pad 30 for testing and evaluation. This distance is less than the distance at which the wafer would bend measurably. The material 36 acts as a compliant spring to support a semiconductor wafer resting on the island surfaces or raised areas 32. A wafer placed on this material causes a depression of the material 36 to produce selective deformation in accordance with the wafer shape.

Any small particles which fall onto the surface of the pad 30 are prevented from producing an image on the top side of a wafer placed on the pad; either because these particles fall into the valleys 34 or the sloped areas between the valleys 34 and the surfaces 32, or when the wafer is placed on the pad, the compliance of the surface 32 is such that any potentially distorting particles are pressed into and deform the area 32 without forming an image on the opposite side of the wafer placed on the pad 30.

The foregoing description of embodiments of the invention is to be considered illustrative and not as limiting. For example, the embodiments may be used for measuring thin substantially flat substrates, other than semiconductor wafers, such as flat panel display glass substrates. Flat panel glass substrates may be very large (some currently are 1.8 meters by 1.5 meters, with thicknesses of 1 mm). The substrates need not be circular and the chuck base also may be slightly concave or convex for some applications where the wafer or substrate is under stress due to films on the surface, for example. Such slight concavity or convexity is considered substantially flat. Also, the pattern of the top surface of the pad 30 which is indicated in FIGS. 8 through 11 may be varied in the form of a large number of different geometric and non-geometric pluralities of raised areas. The substantially square patterns of FIG. 9 merely are used to illustrate the underlying principles of the invention. Various changes will occur to those skilled in the art for performing substantially the same function, in substantially the same way, to achieve substantially the same result without departing from the true scope of the invention as defined in the appended claims.

What is claimed is:

1. A pad for placement on a hard surface and supporting a substrate thereon, the pad comprising:
    a pressure sensitive adhesive layer for attaching the pad to the hard surface,
    a polyurethane impregnated polyester felt base layer adjacent the adhesive layer,
    a microporous polyurethane foam layer adjacent the base layer for receiving the substrate, wherein the foam layer is more readily deformable than the substrate, the foam layer having,
        a top surface having a plurality of islands separated by groves, wherein the islands have co-planar top surfaces, wherein a distance between the islands is less than a distance at which the substrate would bend measurably between the islands, wherein the islands are arranged in a uniformly-spaced orthogonal pattern, and
    the pad having holes formed completely therethrough for permitting pins from the hard surface to contact the substrate.

2. The pad of claim 1, wherein the pad has a thickness of between about 0.035 inches and about 0.065 inches.

3. The pad of claim 1, wherein the base layer has a thickness of about 0.025 inches.

4. The pad of claim 1, wherein the substrate is a silicon wafer with a diameter of between about 200 millimeters and about 300 millimeters inclusive and a thickness of between about 725 microns and about 775 microns inclusive.

5. The pad of claim 1, wherein each of the islands is substantially 0.08 inches square with a density of about 100 islands per square inch,.

\* \* \* \* \*